(12) United States Patent
Li et al.

(10) Patent No.: US 11,243,265 B2
(45) Date of Patent: Feb. 8, 2022

(54) INTELLIGENT LEAKAGE CURRENT DETECTION AND INTERRUPTION DEVICE FOR POWER CORD

(71) Applicant: Chengli Li, Suzhou (CN)

(72) Inventors: Chengli Li, Suzhou (CN); Shengyun Nie, Suzhou (CN)

(73) Assignee: Chengli Li, Suzhou (CN)

( * ) Notice: Subject to any disclaimer, the term of this patent is extended or adjusted under 35 U.S.C. 154(b) by 0 days.

(21) Appl. No.: 17/009,316

(22) Filed: Sep. 1, 2020

(65) Prior Publication Data

US 2020/0393520 A1 Dec. 17, 2020

Related U.S. Application Data

(63) Continuation-in-part of application No. 16/212,505, filed on Dec. 6, 2018, now Pat. No. 10,840,698,
(Continued)

(30) Foreign Application Priority Data

Sep. 22, 2017 (CN) .......................... 201710864829.X
Sep. 22, 2017 (CN) .......................... 201721222432.2
(Continued)

(51) Int. Cl.
*G01R 31/52* (2020.01)
*G01R 31/58* (2020.01)
(Continued)

(52) U.S. Cl.
CPC ............. *G01R 31/52* (2020.01); *G01R 31/58* (2020.01); *H01R 13/713* (2013.01); *H02H 7/22* (2013.01);
(Continued)

(58) Field of Classification Search
CPC ........ H02H 7/228; H02H 1/0007; H02H 7/22; H02H 1/00; H02H 5/04; H02H 3/16;
(Continued)

(56) References Cited

U.S. PATENT DOCUMENTS 4,707,759 A 11/1987 Bodkin
5,708,364 A 1/1998 Vokey et al.
(Continued)

*Primary Examiner* — Danny Nguyen
(74) *Attorney, Agent, or Firm* — Chen Yoshimura LLP

(57) ABSTRACT

An intelligent leakage current detection and interruption device for a power cord, including a switch module configured to control electrical connection of first and second power lines between input and output ends; a leakage current detection module, including first and second leakage current detection lines coupled in series, configured to detect a leakage current on the first and second power lines, respectively; a detection monitoring module, coupled in series to the first and second leakage current detection lines and to the first and second power lines, configured to detect an open circuit condition in the first or second leakage current detection line; and a drive module, coupled to the switch module, the leakage current detection module and the detection monitoring module, configured to drive the switch module to cut off power to the output end in response to any detected leakage current or open circuit condition.

19 Claims, 13 Drawing Sheets

Related U.S. Application Data which is a continuation-in-part of application No. 15/718,661, filed on Sep. 28, 2017, now Pat. No. 10,557,883.

(30) Foreign Application Priority Data

Nov. 22, 2018 (CN) .......................... 201821930686.4
Aug. 28, 2020 (CN) .......................... 202021831041.2

(51) Int. Cl.
  *H02H 7/22* (2006.01)
  *H01R 13/713* (2006.01)
  *H01B 7/32* (2006.01)
  *H02H 3/16* (2006.01)
  *H02H 5/04* (2006.01)

(52) U.S. Cl.
  CPC ............... *H02H 7/228* (2013.01); *H01B 7/32* (2013.01); *H02H 3/16* (2013.01); *H02H 5/04* (2013.01)

(58) Field of Classification Search
  CPC  H02H 5/047; H02H 3/00; H02H 3/02; H02H 9/08; H01R 13/713
  USPC ...................................................... 361/42–50
  See application file for complete search history.

(56) References Cited

U.S. PATENT DOCUMENTS

| | | | |
|---|---|---|---|
| 6,697,238 B2 | 2/2004 | Bonilla et al. | |
| 8,605,402 B2 | 12/2013 | Ward et al. | |
| 9,312,680 B2 | 4/2016 | Li et al. | |
| 9,331,582 B2 | 5/2016 | Goerke | |
| 9,356,402 B2 | 5/2016 | Sung et al. | |
| 9,535,106 B2 | 1/2017 | Li | |
| 9,547,047 B2 | 1/2017 | Li et al. | |
| 9,564,119 B2 | 2/2017 | Ryu et al. | |
| 9,697,926 B2 | 7/2017 | Huang et al. | |
| 10,840,698 B2 | 11/2020 | Li et al. | |
| 10,886,724 B2 | 1/2021 | Li et al. | |
| 2006/0119997 A1 | 6/2006 | Lee | |
| 2007/0159740 A1 | 7/2007 | Williams et al. | |
| 2008/0007878 A1 | 1/2008 | Gandolfi et al. | |
| 2008/0062593 A1 | 3/2008 | Li et al. | |
| 2010/0020452 A1* | 1/2010 | Gandolfi | H02H 3/16 |
| | | | 361/42 |
| 2012/0119918 A1 | 5/2012 | Williams | |
| 2014/0117995 A1 | 5/2014 | Topucharla | |
| 2015/0349517 A1 | 12/2015 | Li et al. | |
| 2016/0111869 A1* | 4/2016 | Li | H02H 3/33 |
| | | | 361/42 |
| 2017/0222425 A1 | 8/2017 | Li et al. | |
| 2021/0027915 A1 | 1/2021 | Aromin et al. | |
| 2021/0125746 A1 | 4/2021 | Aromin et al. | |
| 2021/0125753 A1 | 4/2021 | Aromin et al. | |
| 2021/0125754 A1 | 4/2021 | Aromin et al. | |

\* cited by examiner

INTELLIGENT LEAKAGE CURRENT DETECTION AND INTERRUPTION DEVICE FOR POWER CORD

BACKGROUND OF THE INVENTION

Field of the Invention

This invention relates to electrical appliances, and in particular, it relates to an intelligent leakage current detection and interruption device for power cord.

Description of Related Art

Leakage current detection and interruption devices (LCDI) are a type of safety device to protect against electrical fire. Its main structure is a power cord with a power plug, and it functions to detect leakage current between the hot line or neutral line and the shield layer along the cord from the plug to the electrical load (e.g., air conditioner, dehumidifier, etc.). When a leakage current is detected, the device interrupts the electrical power to the load to prevent fire and ensure safety. Such devices can prevent arc fault fire due to damaged and improper insulation of the hot line, neutral line and ground line of the power cord, which may be caused by aging, wear and tear, pinching, animal chewing, etc.

Current LCDI devices (see FIG. 1) has the following problems: when the leakage current detection line (shield line) 24 for the hot line L 21 or neutral line N 22 of the power line 2 is an open circuit and has lost its protection function, the power cord can still function to conduct power to the load. This presents a hidden threat of fire or other safety issue.

Therefore, there is a need for a leakage current detection and interruption device that can effectively detect leakage current.

SUMMARY

Accordingly, the present invention is directed to an intelligent leakage current detection and interruption device for a power cord, which includes: a switch module, configured to control an electrical connection of first and second power lines between their input and output ends; a leakage current detection module, including first and second leakage current detection lines coupled in series, configured to detect a leakage current on the first and second power lines, respectively; a detection monitoring module, coupled in series to the first and second leakage current detection lines and to the first and second power lines, configured to detect an open circuit condition in the first or second leakage current detection line; and a drive module, coupled to the switch module, the leakage current detection module and the detection monitoring module, configured to drive the switch module to cut off power to the output end in response to any detected leakage current or open circuit condition.

In some embodiments, the detection monitoring module includes at least one resistor and/or at least one diode.

In one embodiment, the detection monitoring module includes a first diode, a first resistor, a second diode and a second resistor, wherein a first end of the first diode is coupled to a first end of the first resistor, a second end of the first diode is coupled to one of the first and second power lines, a second end of the first resistor is coupled to the first leakage current detection line, a first end of the second diode is coupled to another one of the first and second power lines, a second end of the second diode is coupled to a first end of the second resistor, and a second end of the second resistor is coupled to the second leakage current detection line.

In some embodiments, the detection monitoring module includes a first resistor, a second resistor and a first diode.

In some embodiments, the first diode is shared by the drive module and the leakage current detection module.

In one embodiment, a first end of the first resistor is coupled via the first diode and the drive module to one of the first and second power lines, a second end of the first resistor is coupled to the first leakage current detection line, and the second resistor is coupled between another one of the first and second power lines and the second leakage current detection line.

In one embodiment, a first end of the first resistor is coupled via the first diode to one of the first and second power lines, a second end of the first resistor is coupled to the first leakage current detection line, and the second resistor is coupled via the drive module between another one of the first and second power lines and the second leakage current detection line.

In one embodiment, a first end of the first resistor is coupled via the first diode to one of the first and second power lines, a second end of the first resistor is coupled to the first leakage current detection line, and the second resistor is coupled between another one of the first and second power lines and the second leakage current detection line.

In one embodiment, the first resistor is coupled between one of the first and second power lines and the first leakage current detection line, a first end of the second resistor is coupled to another one of the first and second power lines, and a second end of the second resistor is coupled to the second leakage current detection line and also to a first end of the first diode.

In one embodiment, a first end of the first diode is coupled to a first end of the first resistor, a second end of the first diode is coupled to one of the first and second power lines, a second end of the first resistor is coupled to the first leakage current detection line, and the second resistor is coupled between another one of the first and second power lines and the second leakage current detection line.

In one embodiment, the first resistor is coupled between one of the first and second power lines and the first leakage current detection line, a first end of the first diode is coupled to another one of the first and second power lines, a second end of the first diode is coupled to a first end of the second resistor, and a second end of the second resistor is coupled to the second leakage current detection line.

In one embodiment, the first resistor is coupled between one of the first and second power lines and the first leakage current detection line, a first end of the second resistor is coupled to another one of the first and second power lines, a second end of the second resistor is coupled to the second leakage current detection line and also to a first end of the first diode, and a second end of the first diode is coupled to the drive module.

In one embodiment, the detection monitoring module includes a full-wave bridge rectifier, a first resistors and a second resistor, wherein the full-wave bridge rectifier is shared by the detection monitoring module and the drive module.

In one embodiment, a first end of the full-wave bridge rectifier is coupled to one of the first and second power lines, a second end of the full-wave bridge rectifier is coupled to a first end of the first resistor, a second end of the first resistor is coupled to the first leakage current detection line, a third end of the full-wave bridge rectifier is coupled to another one of the first and second power lines, a fourth end of the full-wave bridge rectifier is coupled to a first end of the second resistor, and a second end of the second resistor is coupled to the second leakage current detection line.

In some embodiments, the device further includes a test module, the test module including a test switch which is coupled to the switch module, the leakage current detection module and the detection monitoring module, and when the test switch is closed and no open circuit condition is present on the first and second leakage current detection lines, the drive module drives the switch module to disconnect power to the output end.

The leakage current detection and interruption device can detect whether the first and second leakage current detection lines are intact with no open circuit conditions, thereby enhancing the reliability of the device.

BRIEF DESCRIPTION OF THE DRAWINGS

Preferred embodiments of the present invention are described with reference to the drawings. These drawings serve to explain the embodiments and their operating principle, and only illustrate structures that are necessary to the understanding of the principles of the invention. These drawings are not necessarily to scale. In the drawings, like features are designated by like reference symbols.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

Embodiments of the present invention provide an intelligent leakage current detection and interruption device for a power cord, which includes: a switch module, configured to control an electrical connection between a power input end and a power output end of a first and a second power lines; leakage current detection module, including a first leakage current detection line and a second leakage current detection line coupled in series, configured to detect whether a leakage current is present on the first power line and the second power line, respectively; a detection monitoring module, coupled to the leakage current detection module, by coupling in series to the first and second leakage current detection lines, and configured to detect whether an open circuit condition is present in the first or second leakage current detection line; and a drive module, including at least one semiconductor device, wherein the drive module is coupled to the switch module, the leakage current detection module and the detection monitoring module, and is configured to drive the switch module to cut off power to the power output end in response to the leakage current and the open circuit condition.

Figure 1:
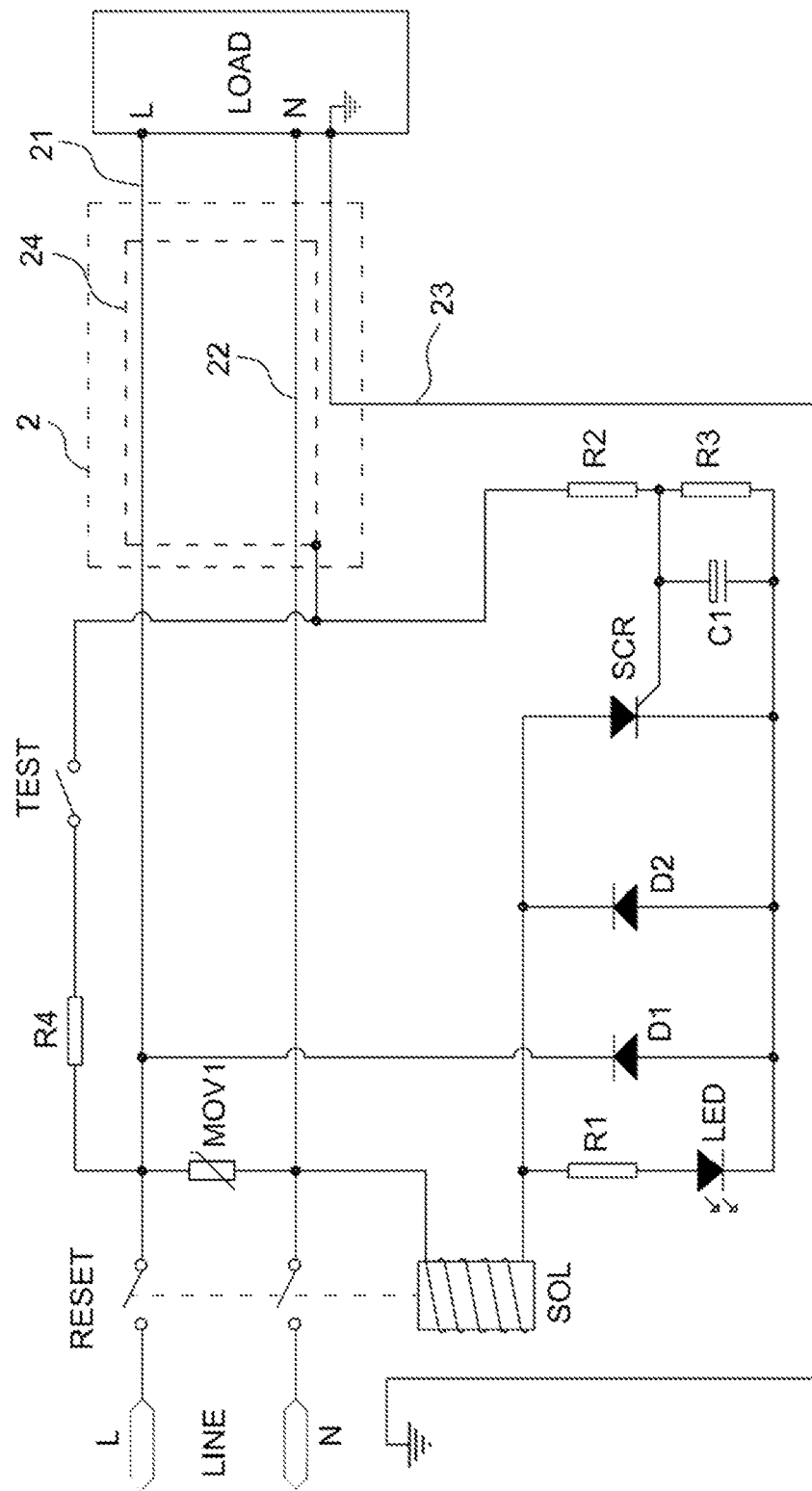
FIG. 1 is a circuit diagram of a conventional LCDI device.
Figure 2:
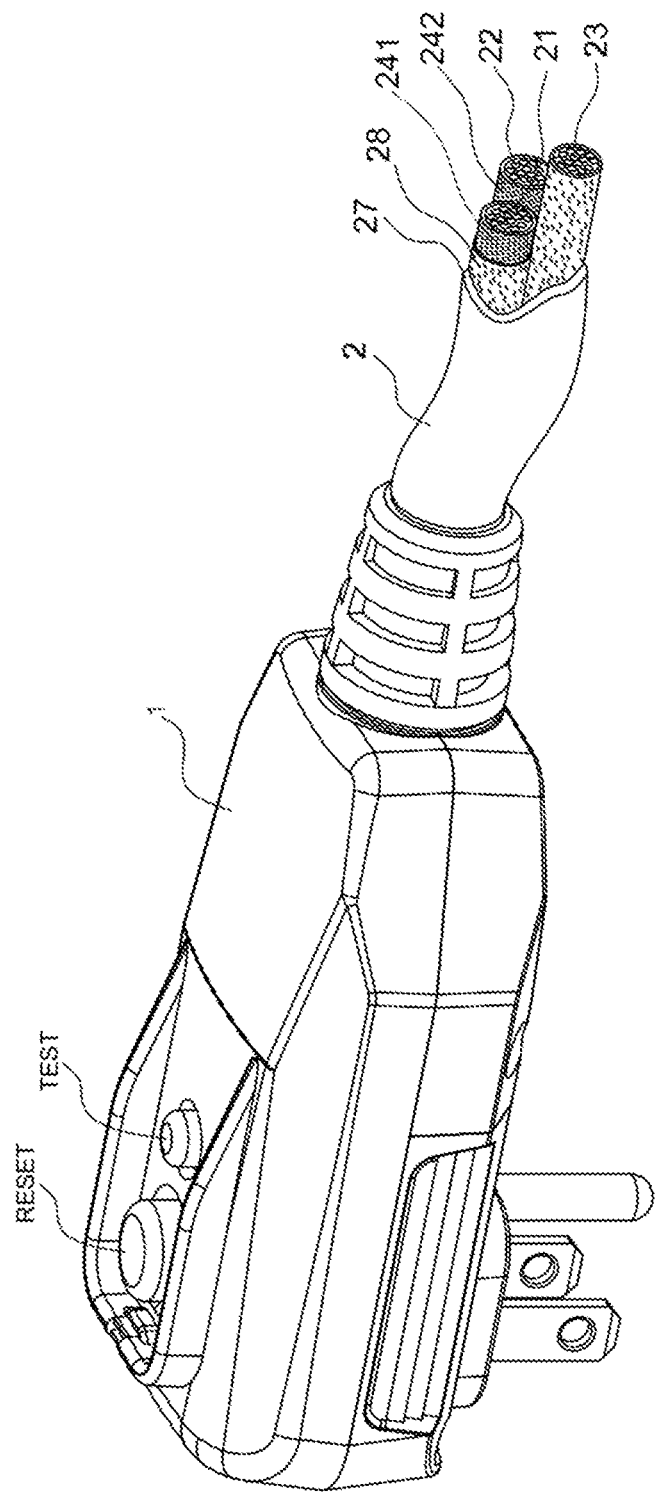
FIG. 2 is an exterior view of a power plug according to embodiments of the present invention.
Figure 3:
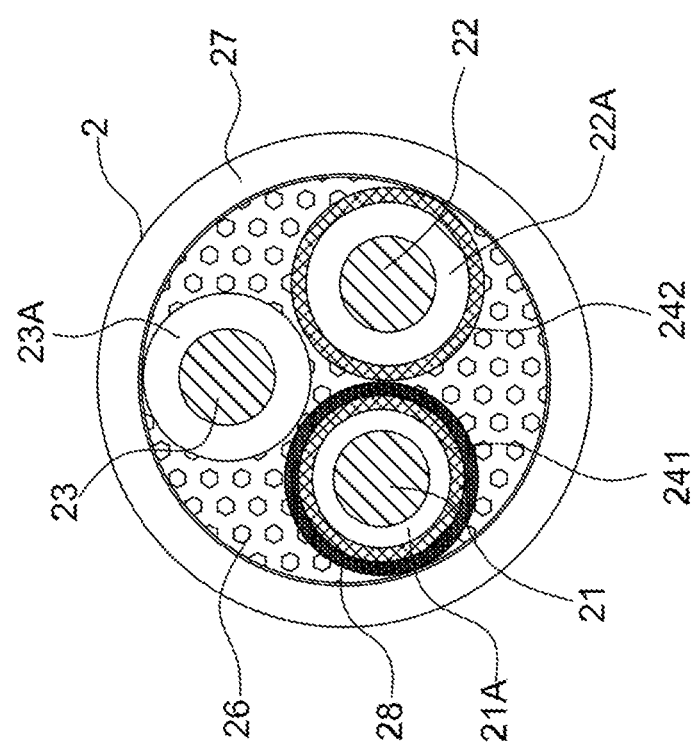
FIG. 3 is a cross-sectional view of the cord.

As shown in FIG. 2, the intelligent leakage current detection and protection device for a power cord has a plug 1 and an external power cord 2. The plug 1 includes a test switch TEST and a reset switch RESET. In the embodiment shown in FIG. 2, the power cord 2 includes a hot line (L) 21, a neutral line (N) 22, a ground line (G) 23, leakage current detection lines (shield lines) 241 and 242, and an insulating cover 27. The exterior cross-section of the power cord 2 may be round, where the hot line 21, neutral line 22, and ground line 23 are respectively covered by insulating layers 21A, 22A and 23A (see FIG. 3). In the embodiment shown in FIG. 3, the leakage current detection lines 241 and 242 respectively cover (surround) the insulating layers 21A and 22A. It should be understood that the exterior cross-section of the power cord 2 may be oblong with a side-by-side configuration, or other shapes. It should also be understood that in other embodiments, the power cord 2 may include other signal lines. As shown in FIG. 3, the power cord 2 may include filling materials 26. The leakage current detection line 241 is covered by an insulating structure 28, but the leakage current detection line 242 is not covered by such an insulating structure. Alternatively (not shown), leakage current detection line 242 is covered by an insulating structure, but the leakage current detection line 241 is not covered by such an insulating structure. Or (not shown), both leakage current detection lines 241 and 242 are separately covered by an insulating structure. The leakage current detection lines 241 and 242 may be woven structures made of metal (e.g., copper, aluminum, etc.) (see FIG. 3), or a wound structures formed of one or more metal wires (not shown in the drawings), or metal foil covers (not shown in the drawings), or combinations of the above. The insulating structure 28 may be a plastic material formed in one piece, or it may be formed of insulating paper or fabric or other insulating materials surrounding the wires. The leakage current detection lines 241 and 242 may be a one-sided insulating material (i.e., a sheet material that is electrically conductive on one side and electrically insulating on the opposite side) forming a cover, which can eliminate the need for a separate insulating structure 28 (not shown in the figures). The leakage current detection line 241 encloses at least one power supply wire (e.g., current carrying lines like the hot line (L) 21, the neutral line (N) 22, etc.). The leakage current detection line 241 may simultaneously encloses both the hot line 21 and the neutral line 22, the insulating structure 28 encloses the leakage current detection line 241 and the ground line 23, and the leakage current detection line 242 encloses the insulating structure 28. It should be understood that the leakage current detection line 241 or the leakage current detection line 242 may simultaneously encloses multiple power supply wires (current carrying wires).

Figure 4A:
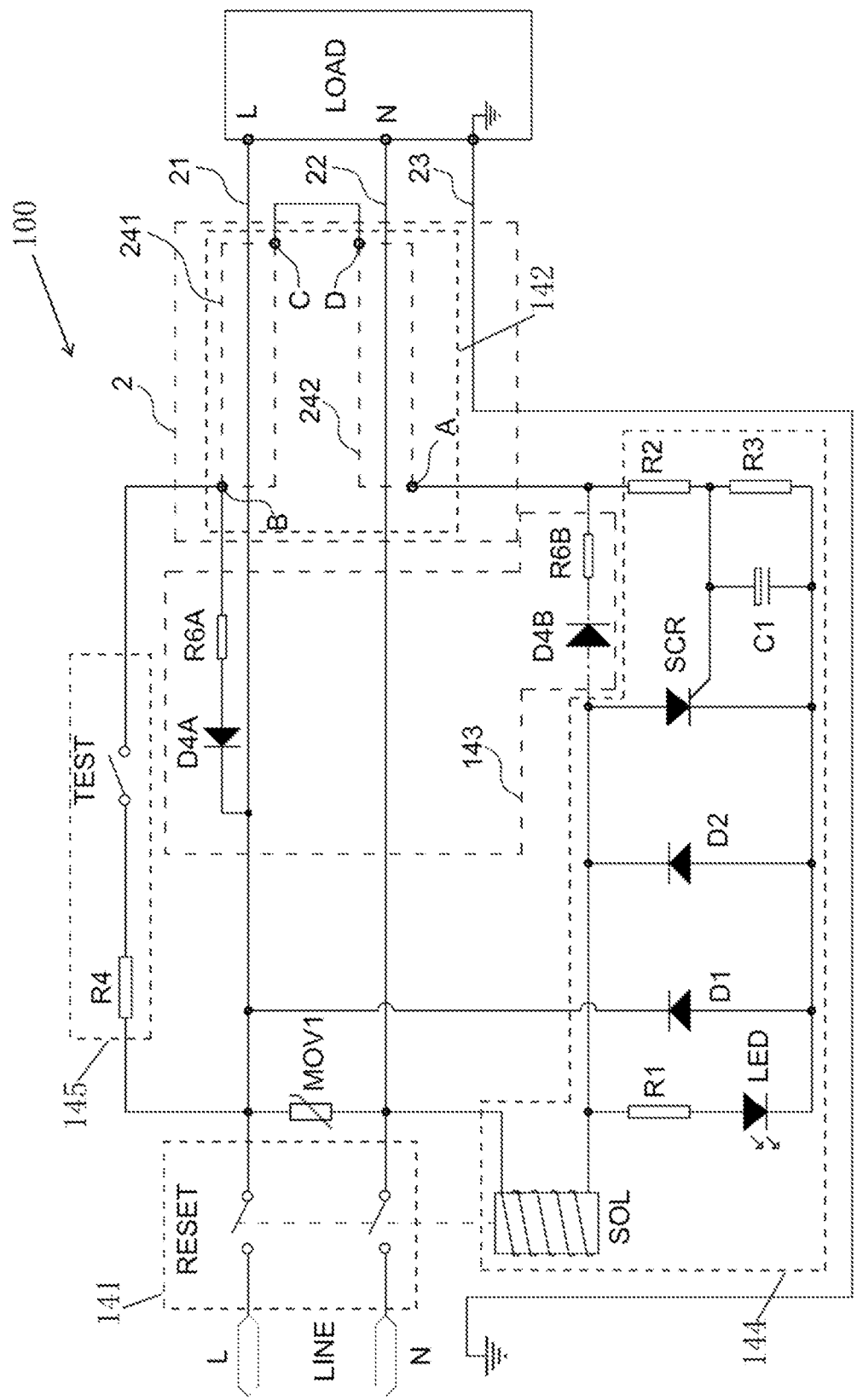
FIG. 4A is a circuit diagram showing an LCDI device according to a first embodiment of the present invention.

FIG. 4A is a circuit diagram showing an LCDI device according to a first embodiment of the present invention. As shown in FIG. 4A, the intelligent leakage current detection and interruption device 100 for a power cord includes a switch module 141, a leakage current detection module 142, a detection monitoring module 143, and a drive module 144. The switch module 141 includes a reset switch RESET. The switch module 141 is configured to control the electrical connection between a power input end LINE and a power output end LOAD of the device. The leakage current detection module 142 includes at least leakage current detection lines 241 and 242. The leakage current detection lines 241 and 242 are coupled in series via the load-side end C of the leakage current detection line 241 and the load-side end D of leakage current detection line 242, and respectively function to detect whether a leakage current is present on the hot line L and neutral line N. The detection monitoring module 143 is configured to detect whether the leakage current detection lines 241 and 242 have any open circuit fault condition. The detection monitoring module 143 includes diodes D4A and D4B, and resistors R6A and R6B. The anode of diode D4A is coupled in series with one end of resistor R6A, and the cathode of diode D4A is coupled to the hot line L and further to the reset switch RESET via the hot line L. The other end of resistor R6A is coupled to the line-side end B of the leakage current detection line 241. The cathode of diode D4B is coupled in series with one end of resistor R6B. The other end of resistor R6B is coupled to the line-side end A of the leakage current detection line 242 and also to one end of another resistor R2. The anode of diode D4B is coupled to the anode of a silicon controlled rectifier SCR of the drive module 144, and to one end of a solenoid SOL. The other end of the solenoid SOL is coupled to the neutral line N. The solenoid SOL is mechanically coupled to the reset switch RESET of the switch module 141. The drive module 144 further includes diodes D1 and D2, capacitor C1, and resistors R2 and R3. The cathode and the control gate of the silicon controlled rectifier SCR are respectively coupled to the two ends of capacitor C1. Capacitor C1 is coupled in parallel with resistor R3. One end of resistor R2 is coupled to point A; the other end of resistor R2 is coupled to one end of the parallelly coupled capacitor C1 and resistor R3 and also to the control gate of the silicon controlled rectifier SCR. The anode of diode D1 is coupled to the cathode of the silicon controlled rectifier SCR. The cathode of diode D1 is coupled to the hot line L and further to the switch module 141 via the hot line L.

The working principle of the circuit of FIG. 4A is described below. When the leakage current detection lines 241 and 242 are functioning normally (i.e., they do not have any open circuit condition), by the setting of resistors R6A and R6B, the point A is limited to a relatively low voltage level, so the silicon controlled rectifier SCR is not triggered to conduct. In this condition, when the LCDI device is connected to the power source, it will function normally to conduct power to the load. When an open circuit condition exists at any point on the leakage current detection line 241 and/or 242, a current loop is formed from the neutral line N via SOL-D 4B-R6B-R2-R3-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

As shown in FIG. 4A, the leakage current detection and interruption device 100 further includes a test module 145, which includes resistor R4 and test switch TEST. One end of resistor R4 is coupled in series to one end of the test switch TEST; the other end of resistor R4 is coupled to the hot line L and further to the switch module 141 via the hot line L. The other end of the test switch TEST is coupled between resistor R6A and the leakage current detection line 241. Normally, the test switch TEST is open; so when the leakage current detection lines 241 and 242 are functioning normally (no open circuit condition) and there is no leakage current between the power lines 21, 22, 23 and the leakage current detection lines 241, 242, the silicon controlled rectifier SCR is not triggered and the LCDI device functions normally to conduct power to the load. When the test switch TEST is closed (e.g., when manually depressed by a user), a simulated leakage current flows in a test current loop from the hot line L via resistor R4, test switch TEST, leakage current detection lines 241 and 242, resistors R2 and R3, diode D2, solenoid SOL to the neutral line N. This simulated current causes the voltage across resistor R3 to increase to a sufficient level, which triggers the silicon controlled rectifier SCR to be conductive. As seen from FIG. 4A, when the silicon controlled rectifier SCR is conductive, a trip current loop is formed from the neutral line N via solenoid SOL, silicon controlled rectifier SCR, and diode D1 to the hot line L. As a result, the current in the solenoid SOL generates a magnetic field to actuate the reset switch RESET, causing the device to trip and cut off the power to the load. When any circuit or components on the test current loop has an open circuit condition, the device will not trip when the test switch TEST is closed. Therefore, the user can manually operate the test switch TEST to test whether the leakage current detection lines 241 and 242 are intact and functioning normally. It should be understood that the test switch TEST can test whether any component on the test current loop has an open circuit condition. It should also be noted that when a true leakage current is present between the hot line L and the leakage current detection line 241 or between the neutral line N and the leakage current detection line 242, such a leakage current will cause the solenoid SOL to actuate the reset switch based on the same principle described above.

Figure 4B:
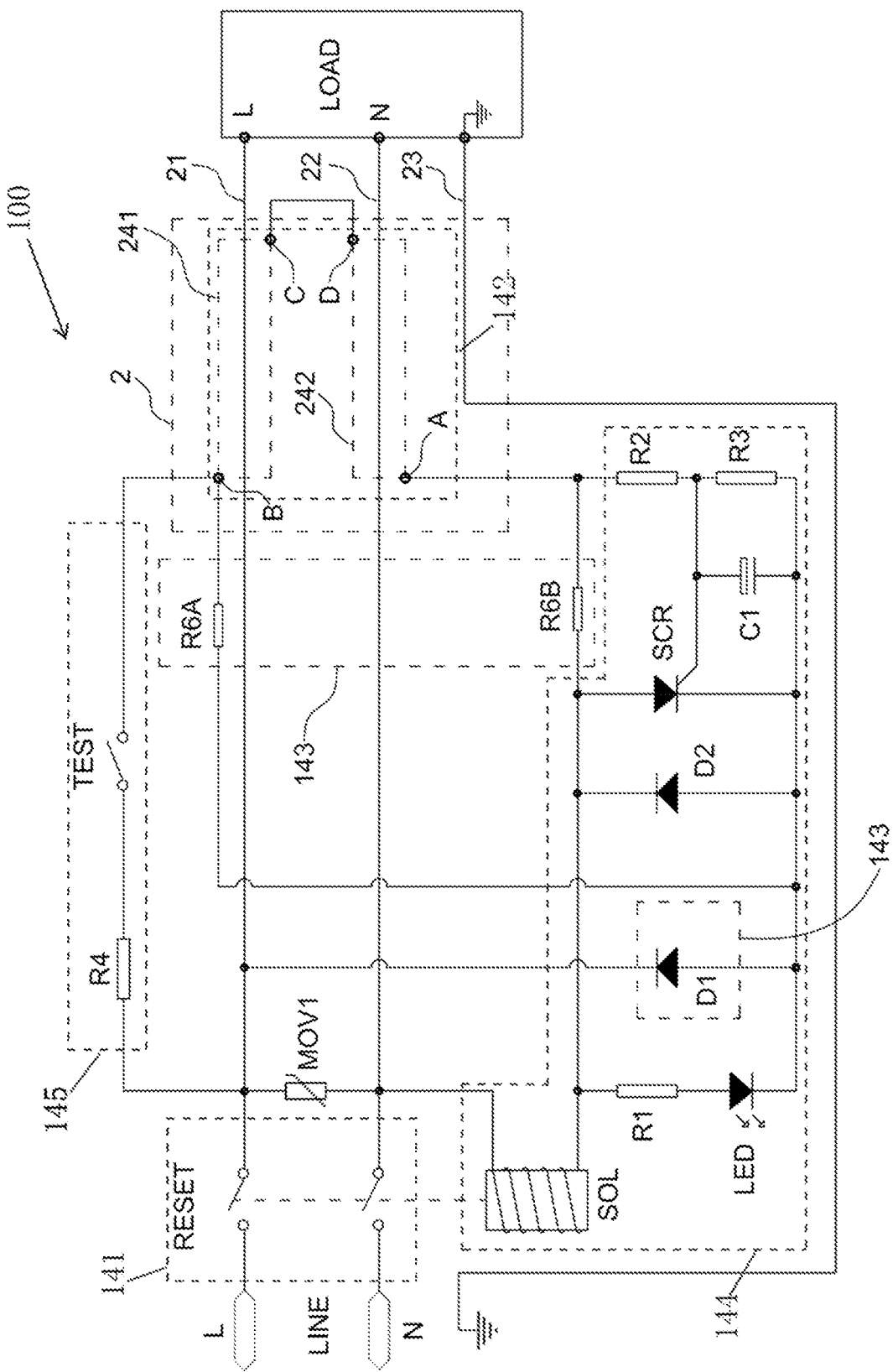
FIG. 4B is a circuit diagram showing an LCDI device according to a second embodiment of the present invention.

FIG. 4B is a circuit diagram schematically illustrating an LCDI device according to a second embodiment of the present invention. This embodiment is similar to the first embodiment in FIG. 4A, but here, the detection monitoring module 143 does not include diodes D4A and D4B. Rather, the detection monitoring module 143 includes resistors R6A, R6B and diode D1. One end of resistor R6A is coupled to the point B of the leakage current detection line 241, and the other end of resistor R6A is coupled to the cathode of the silicon controlled rectifier SCR. Resistor R6B is coupled between the anode of the silicon controlled rectifier SCR and the point A of the leakage current detection line 242. Diode D1 is shared by the drive module 144 and the detection monitoring module 143.

When the leakage current detection lines 241 and 242 are functioning normally (no open circuit), by the setting of resistors R6A and R6B, the point A is limited to a relatively low voltage level, so the silicon controlled rectifier SCR is not triggered to conduct. In this condition, when the LCDI device is connected to the power source, it will function normally to conduct power to the load. When an open circuit condition exists at any point on the leakage current detection line 241 and/or 242, a current loop is formed from the neutral line N via SOL-R6B-R2-R3-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In this embodiment, the working principle of the test module 145 is the same as in the first embodiment and will not be further described.

Figure 5A:
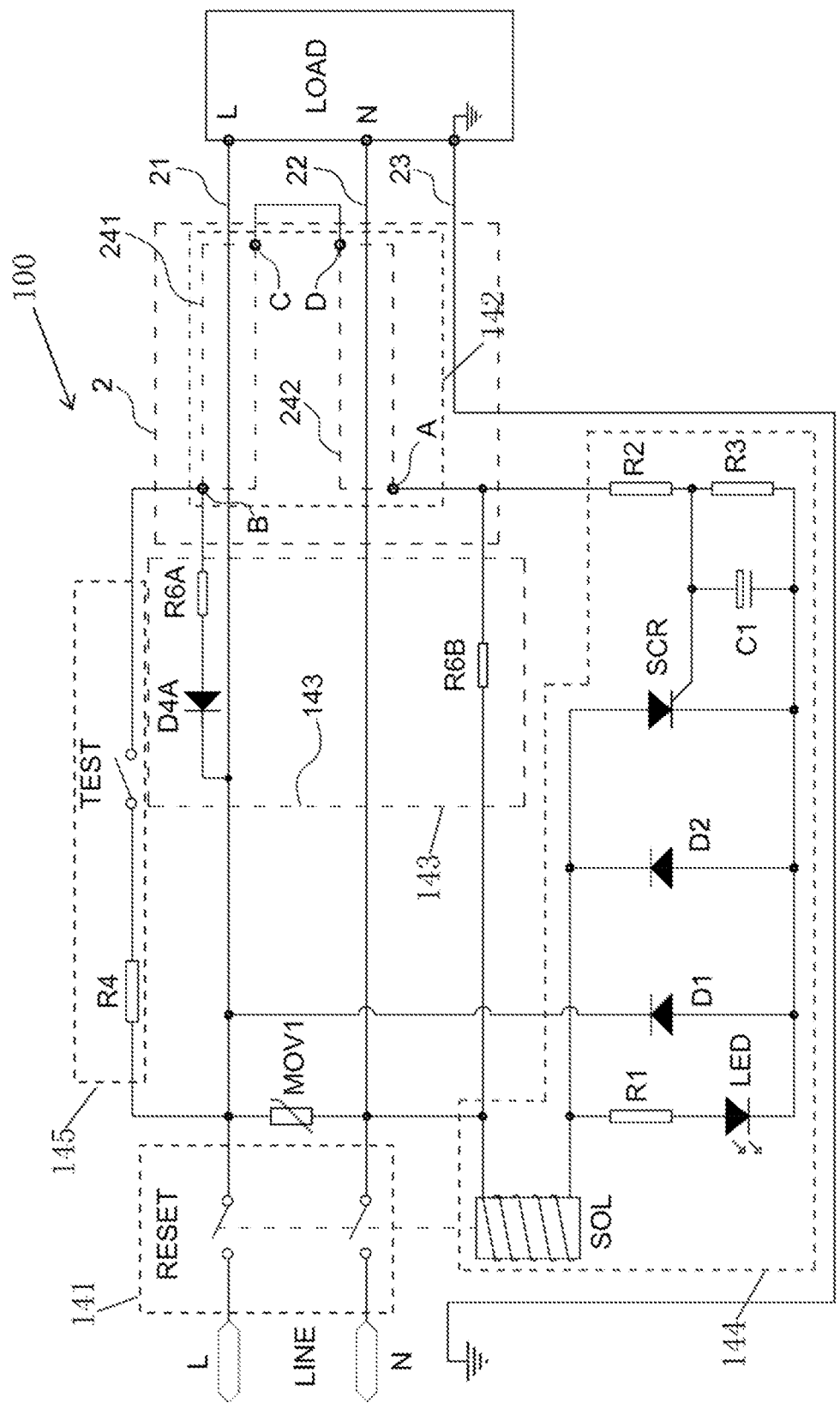
FIG. 5A is a circuit diagram showing an LCDI device according to a third embodiment of the present invention.

FIG. 5A is a circuit diagram schematically illustrating an LCDI device according to a third embodiment of the present invention. This embodiment is similar to the first embodiment in FIG. 4A, but here, the detection monitoring module 143 does not include diode D4B. Rather, the detection monitoring module 143 includes diode D4A and resistors R6A, R6B. One end of resistor R6B is coupled directly to the neutral line N, and further coupled to the switch module 141 via the neutral line N. The other end of resistor R6B is coupled to point A of the leakage current detection line 242.

When the leakage current detection lines 241 and 242 are functioning normally (no open circuit), by the setting of resistors R6A and R6B, the point A is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the neutral line N via R6B-R2-R3-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In this embodiment, the working principle of the test module 145 is the same as in the first embodiment and will not be further described.

Figure 5B:
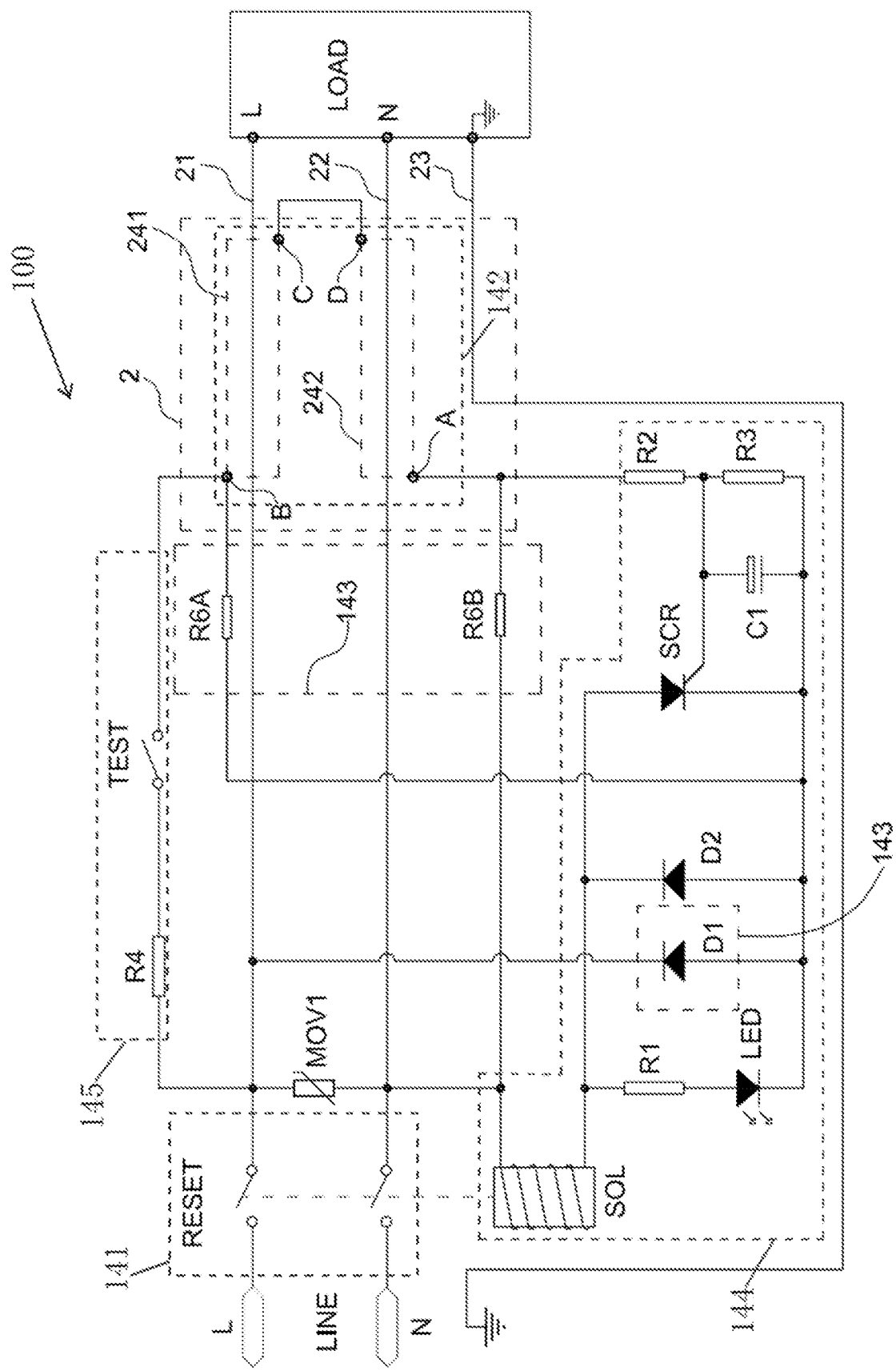
FIG. 5B is a circuit diagram showing an LCDI device according to a fourth embodiment of the present invention.

FIG. 5B is a circuit diagram schematically illustrating an LCDI device according to a fourth embodiment of the present invention. In this embodiment, the detection monitoring module 143 has the same components as the second embodiment in FIG. 4B, but here, resistor R6B is connected differently. In FIG. 5B, one end of resistor R6B is coupled directly to the neutral line N without going through the solenoid SOL, and further coupled to the switch module 141 via the neutral line N. The other end of resistor R6B is coupled to point A of the leakage current detection line 242.

When the leakage current detection lines 241 and 242 are functioning normally (no open circuit), by the setting of resistors R6A and R6B, the point A is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the neutral line N via R6B-R2-R3-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In this embodiment, the working principle of the test module 145 is the same as in the first embodiment and will not be further described.

Figure 6A:
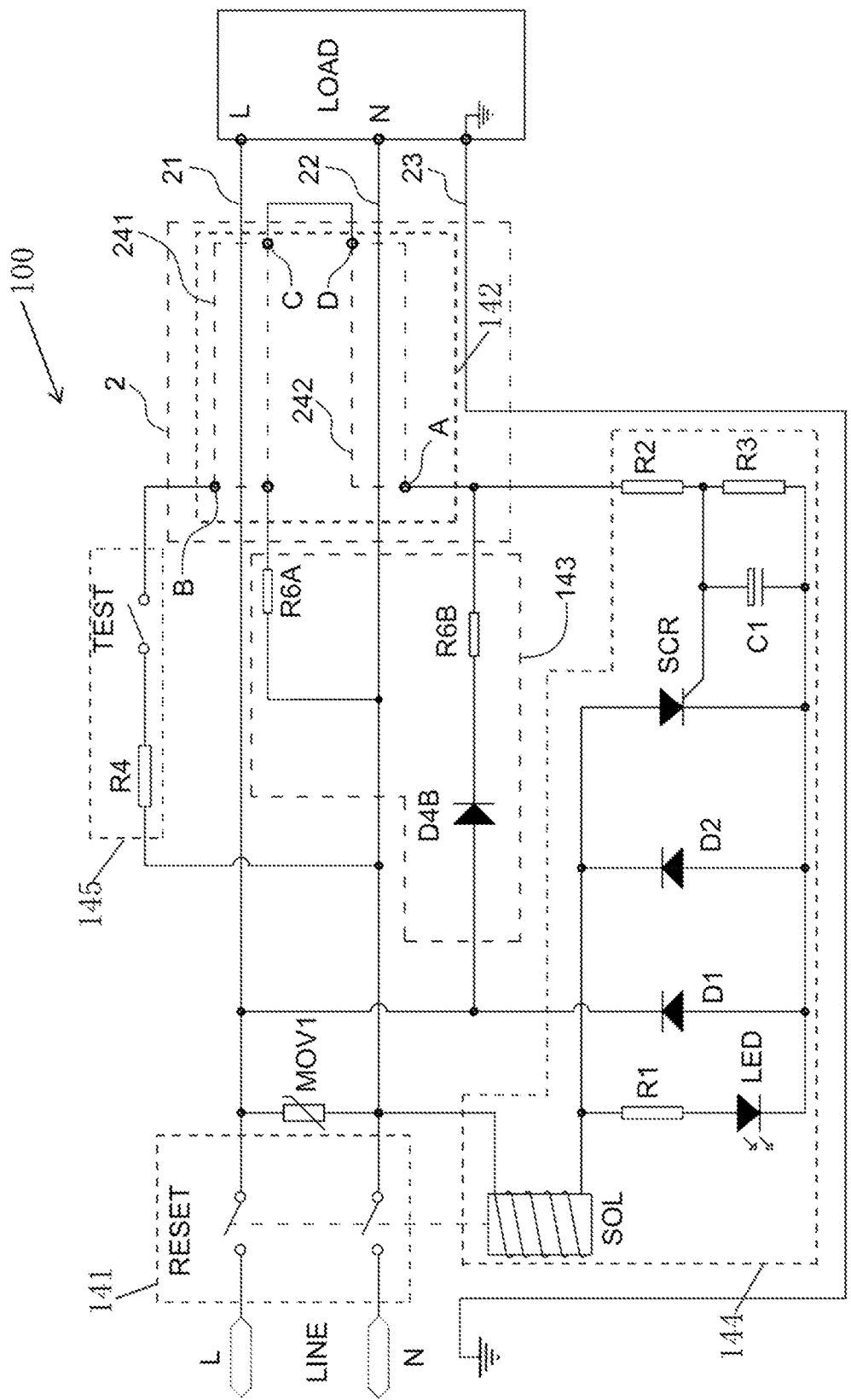
FIG. 6A is a circuit diagram showing an LCDI device according to a fifth embodiment of the present invention.

FIG. 6A is a circuit diagram schematically illustrating an LCDI device according to a fifth embodiment of the present invention. This embodiment is similar to the first embodiment in FIG. 4A, but here, the detection monitoring module 143 does not include diode D4A. Rather, the detection monitoring module 143 includes resistor R6A, diode D4B and resistor R6B. One end of resistor R6A is coupled to the neutral line N and further coupled to the switch module 141 via the neutral line N. The other end of resistor R6A is coupled to the point B of the leakage current detection line 242. The anode of diode D4B is coupled directly to the hot line L without going through the solenoid SOL, and further coupled to the switch module 141 via the hot line L. The cathode of diode D4B is coupled to one end of resistor R6B, and the other end of resistor R6B is coupled to the point A of the leakage current detection line 242.

When the leakage current detection lines 241 and 242 are functioning normally (no open circuit), by the setting of resistors R6A and R6B, the point A is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the hot line L via D4B-R6B-R2-R3-D2-SOL to the neutral line N, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In this embodiment, the working principle of the test module 145 is the same as in the first embodiment except that resistor R4 is coupled to the neutral line N and that the current flow direction of the test current loop is from the neutral line N to the hot line L. Further descriptions are omitted.

Figure 6B:
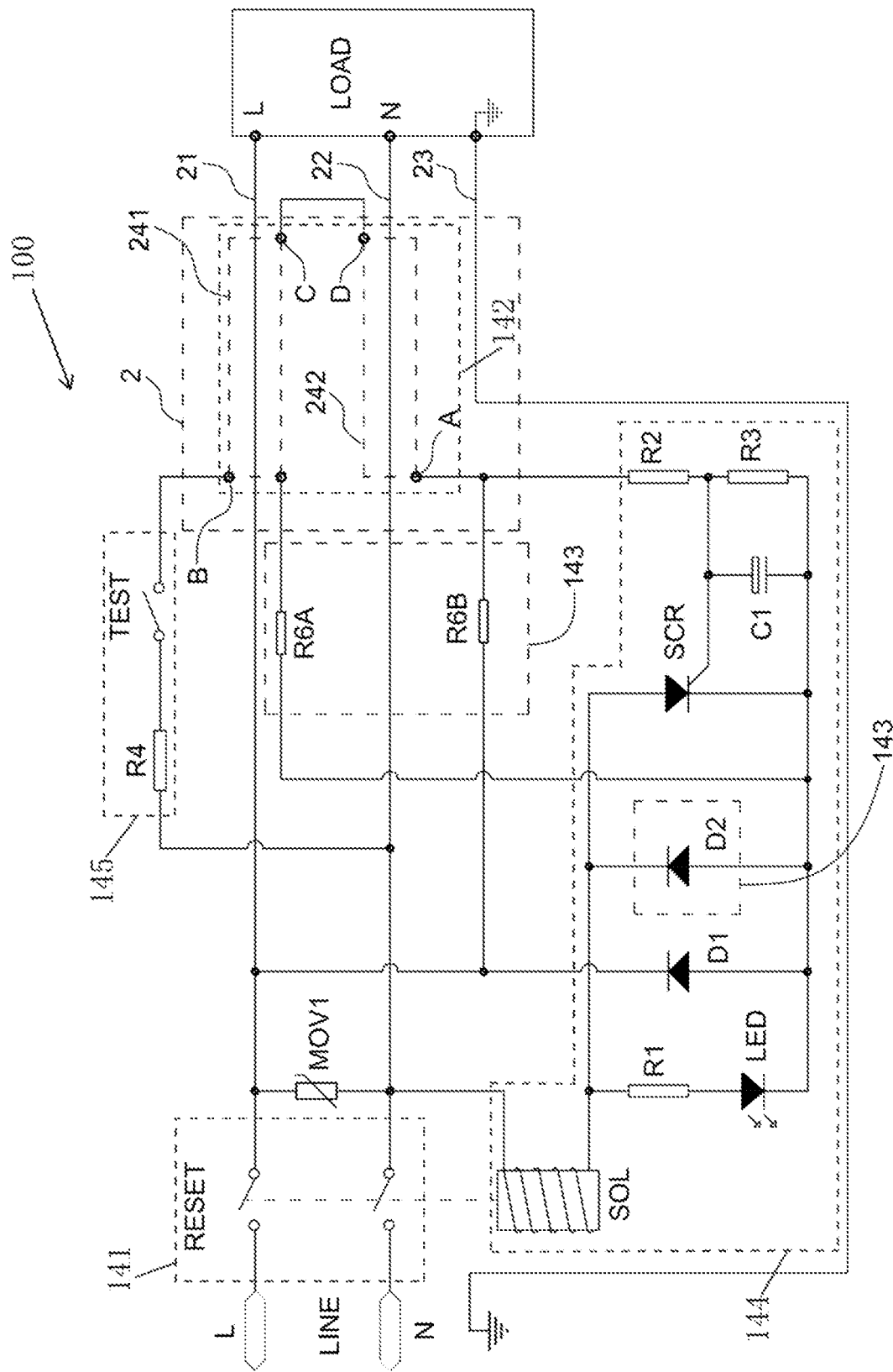
FIG. 6B is a circuit diagram showing an LCDI device according to a sixth embodiment of the present invention.

FIG. 6B is a circuit diagram schematically illustrating an LCDI device according to a sixth embodiment of the present invention. This embodiment is similar to the fifth embodiment in FIG. 6A, but here, the detection monitoring module 143 does not include diode D4B. Rather, the detection monitoring module 143 includes resistors R6A, R6B and diode D2. One end (namely, the end on the left in the configuration of FIG. 6B) of resistor R6A is not coupled to the neutral line N but rather, coupled to the cathode of the silicon controlled rectifier SCR. Diode D2 is shared by the drive module 144 and detection monitoring module 143.

When the leakage current detection lines 241 and 242 are functioning normally (no open circuit), by the setting of resistors R6A and R6B, the point A is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the hot line L via R6B-R2-R3-D2-SOL to the neutral line N, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load. In this embodiment, the working principle of the test module 145 is the same as in the fifth embodiment of FIG. 6A, and will not be further described.

Figure 7:
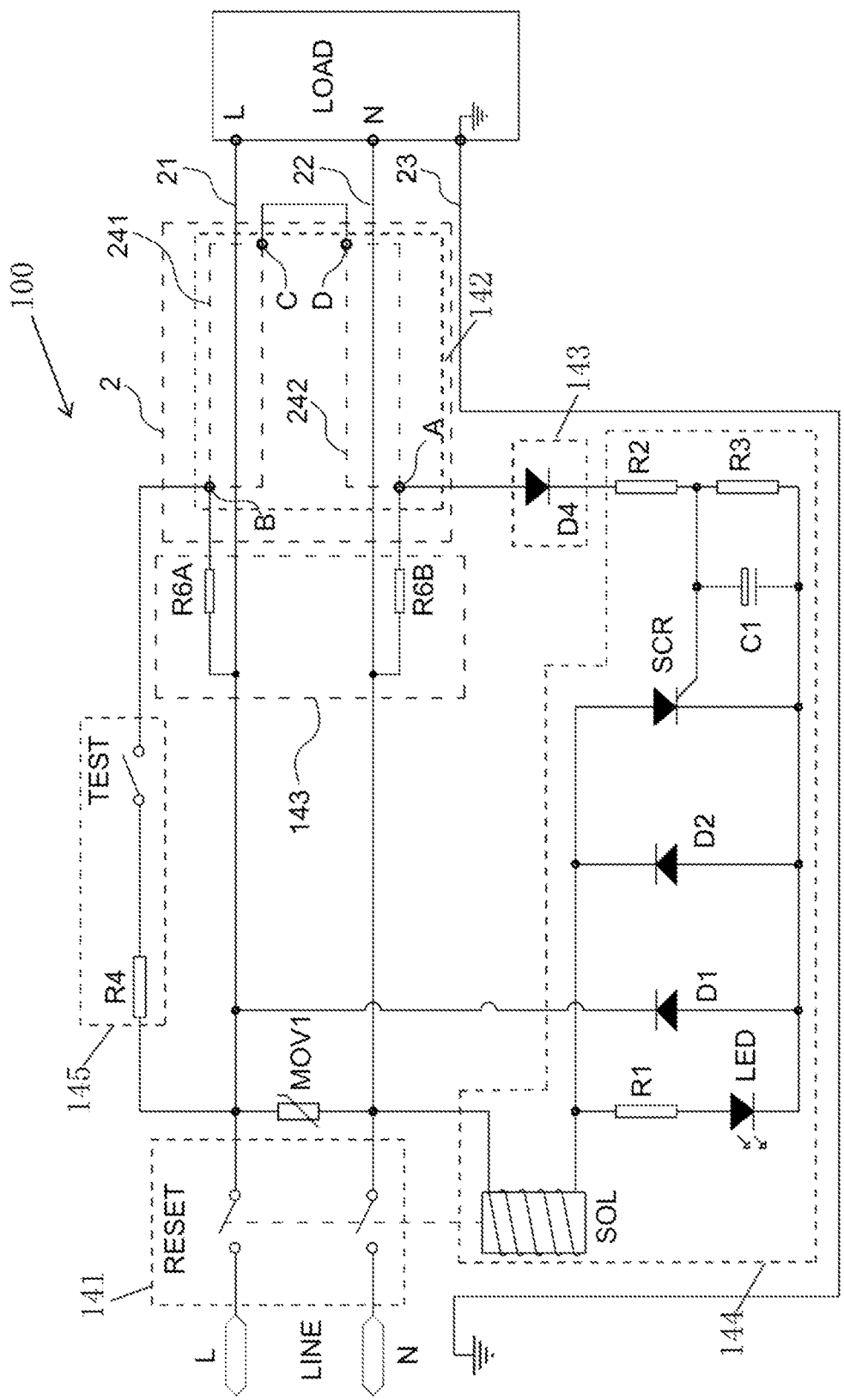
FIG. 7 is a circuit diagram showing an LCDI device according to a seventh embodiment of the present invention.

FIG. 7 is a circuit diagram schematically illustrating an LCDI device according to a seventh embodiment of the present invention. This embodiment is similar to the third embodiment in FIG. 5A, but here, the detection monitoring module 143 does not include diode D4A. Rather, the detection monitoring module 143 includes resistor R6A, R6B and diode D4. Diode D4 is coupled between the point A of the leakage current detection line 242 and resistor R2. The function of diode D4 is to prevent discharge of the energy stored in capacitor C1 during a half cycle of the AC current which would have caused capacitor C1 to be unable to trigger the silicon controlled rectifier SCR.

When the leakage current detection lines 241 and 242 are functioning normally (no open circuit), by the setting of resistors R6A and R6B, the point A is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the neutral line N via R6B-D4-R2-R3-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In this embodiment, the working principle of the test module 145 is the same as in the third embodiment of FIG. 5A, and will not be further described.

Figure 8:
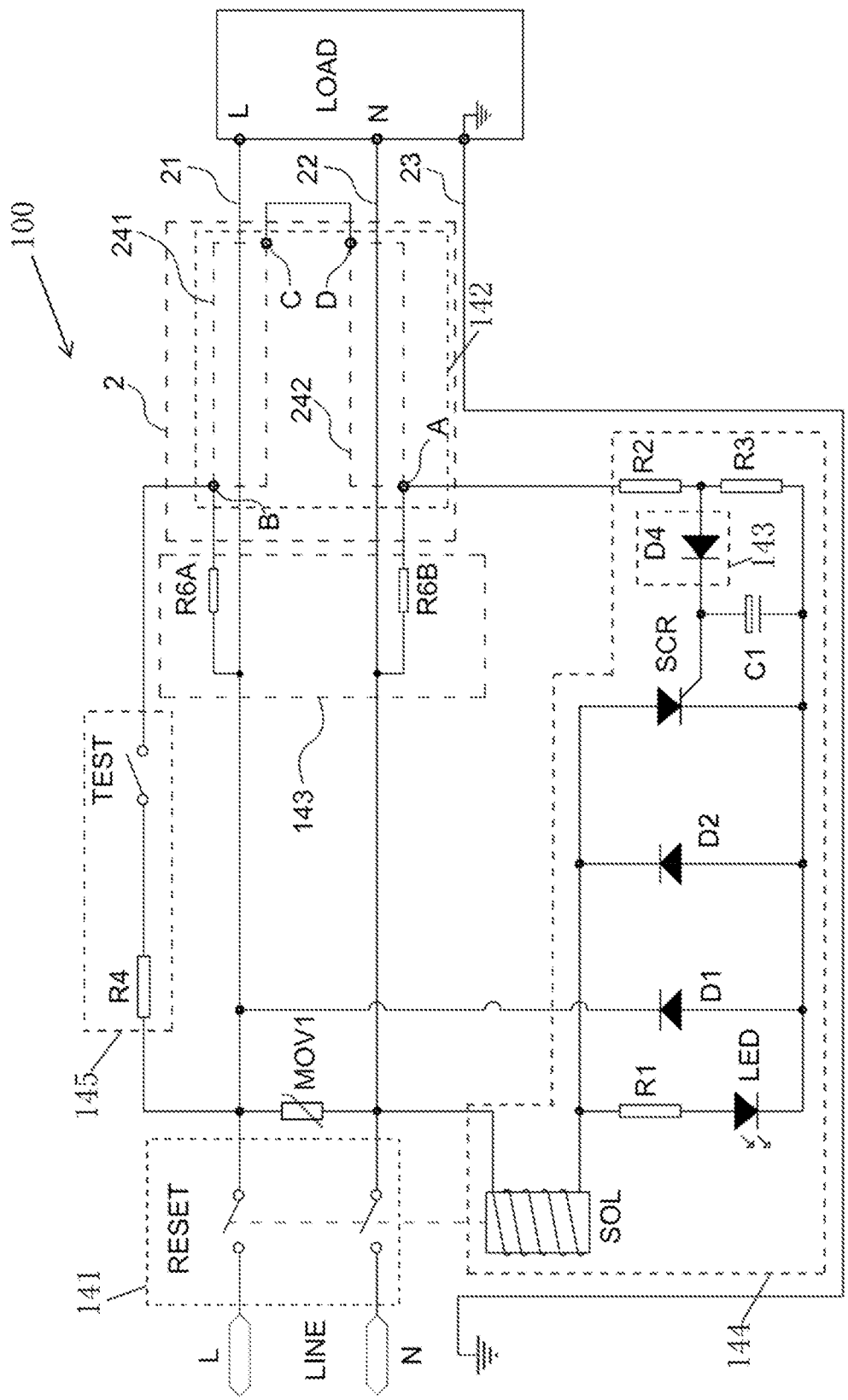
FIG. 8 is a circuit diagram showing an LCDI device according to an eighth embodiment of the present invention.

FIG. 8 is a circuit diagram schematically illustrating an LCDI device according to an eighth embodiment of the present invention. This embodiment is similar to the seventh embodiment in FIG. 7, but here, diode D4 is connected differently. In FIG. 8, diode D4 is shared by the detection monitoring module 143 and the drive module 144. The cathode of diode D4 is coupled to the control gate of the silicon controlled rectifier SCR, and the anode of diode D4 is coupled between resistors R2 and R3. The function of diode D4 is the same as in the seventh embodiment of FIG. 7.

When the leakage current detection lines 241 and 242 are functioning normally (no open circuit), by the setting of resistors R6A and R6B, the point A is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the neutral line N via R6B-R2-R3-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In this embodiment, the working principle of the test module 145 is the same as in the seventh embodiment of FIG. 7, and will not be further described.

Figure 9:
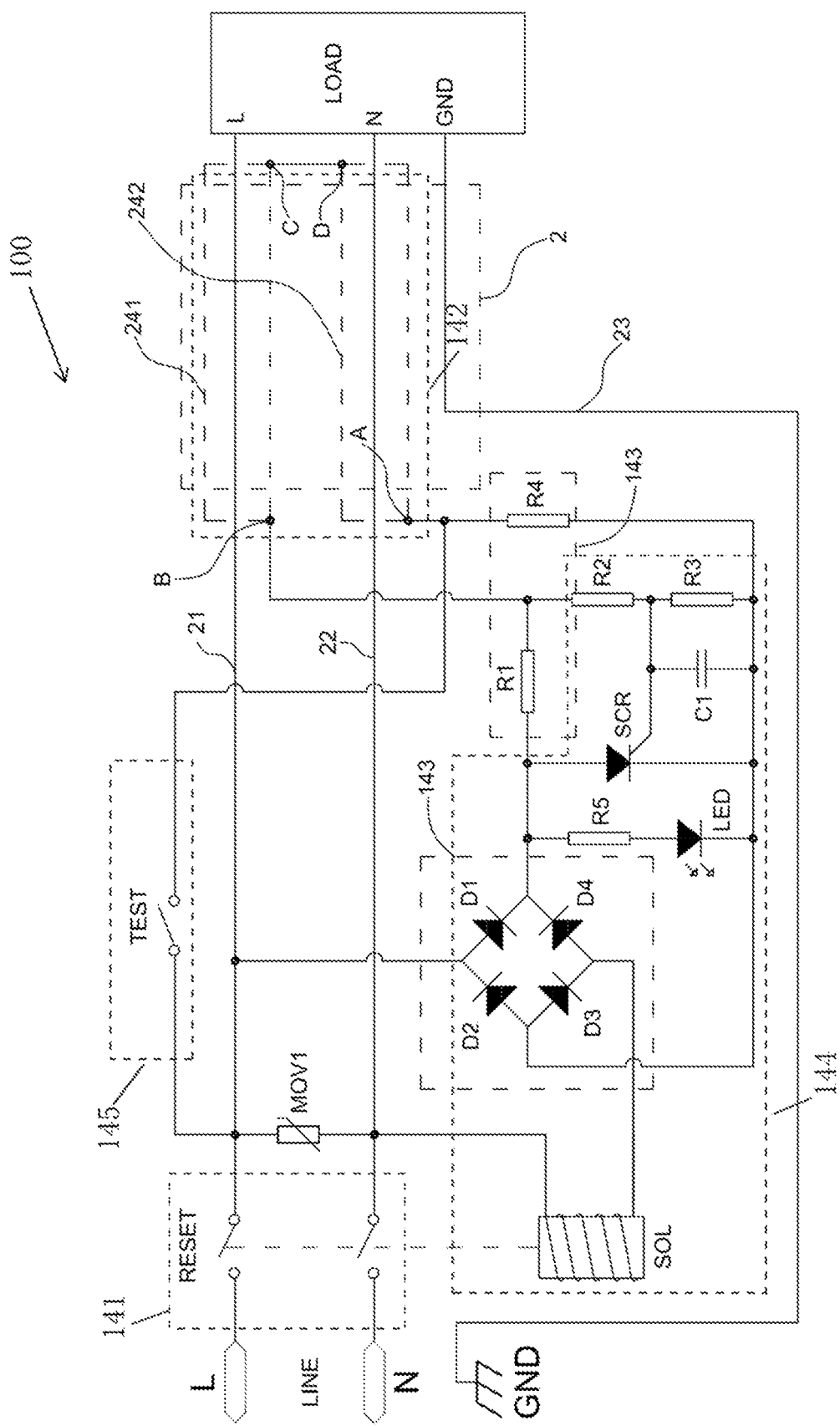
FIG. 9 is a circuit diagram showing an LCDI device according to a ninth embodiment of the present invention.

FIG. 9 is a circuit diagram schematically illustrating an LCDI device according to a ninth embodiment of the present invention. This embodiment is similar to earlier described embodiments, but here, the detection monitoring module 143 includes a full-wave bridge rectifier and resistors R1 and R4. The full-wave bridge rectifier is shared by the detection monitoring module 143 and drive module 144. The upper end (first end) of the full-wave bridge rectifier is coupled to the hot line L, the right end (second end) of the full-wave bridge rectifier is coupled to the anode of the silicon controlled rectifier SCR, the lower end (third end) of the full-wave bridge rectifier is coupled via the solenoid SOL to the neutral line N, and the left end (fourth end) of the full-wave bridge rectifier is coupled to the cathode of the silicon controlled rectifier SCR. Resistor R1 is coupled between the anode of the silicon controlled rectifier SCR and the point B of the leakage current detection line 241. Resistor R4 is coupled between the cathode of the silicon controlled rectifier SCR and the point A of the leakage current detection line 242.

When the leakage current detection lines 241 and 242 are functioning normally (no open circuit), by the setting of resistors R1 and R4, the point B is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the hot line L via D1 R1 R2 R3 D3 SOL to the neutral line N, so that the voltage across resistor R3 increases to a sufficient level to trigger the silicon controlled rectifier SCR to be conductive. This forms a current loop from the neutral line N via SOL-D4-SCR-D2 to the hot line L. As a result, the solenoid SOL generates a magnetic field to actuate the reset switch RESET, causing the device to trip and cut off power to the load.

In this embodiment, the working principle of the test module 145 is similar to the earlier described embodiments with the following differences. The test module 145 only includes the test switch TEST. The test switch TEST is coupled to the point A of the leakage current detection line 242. The test switch TEST is normally open; so when the leakage current detection lines 241 and 242 are functioning normally (no open circuit condition) and there is no leakage current between the power lines 21, 22, 23 and the leakage current detection lines 241, 242, the silicon controlled rectifier SCR is not triggered and the LCDI device functions normally to conduct power to the load. When the test switch TEST is closed, a simulated leakage current flows in a test current loop from the hot line L via test switch TEST, leakage current detection lines 241 and 242, resistors R2 and R3, diode D3, solenoid SOL to the neutral line N. This simulated current causes the voltage across resistor R3 to increase to a sufficient level, which triggers the silicon controlled rectifier SCR to be conductive. As a result, the reset switch RESET is actuated to cut off power to the load.

Figure 10:
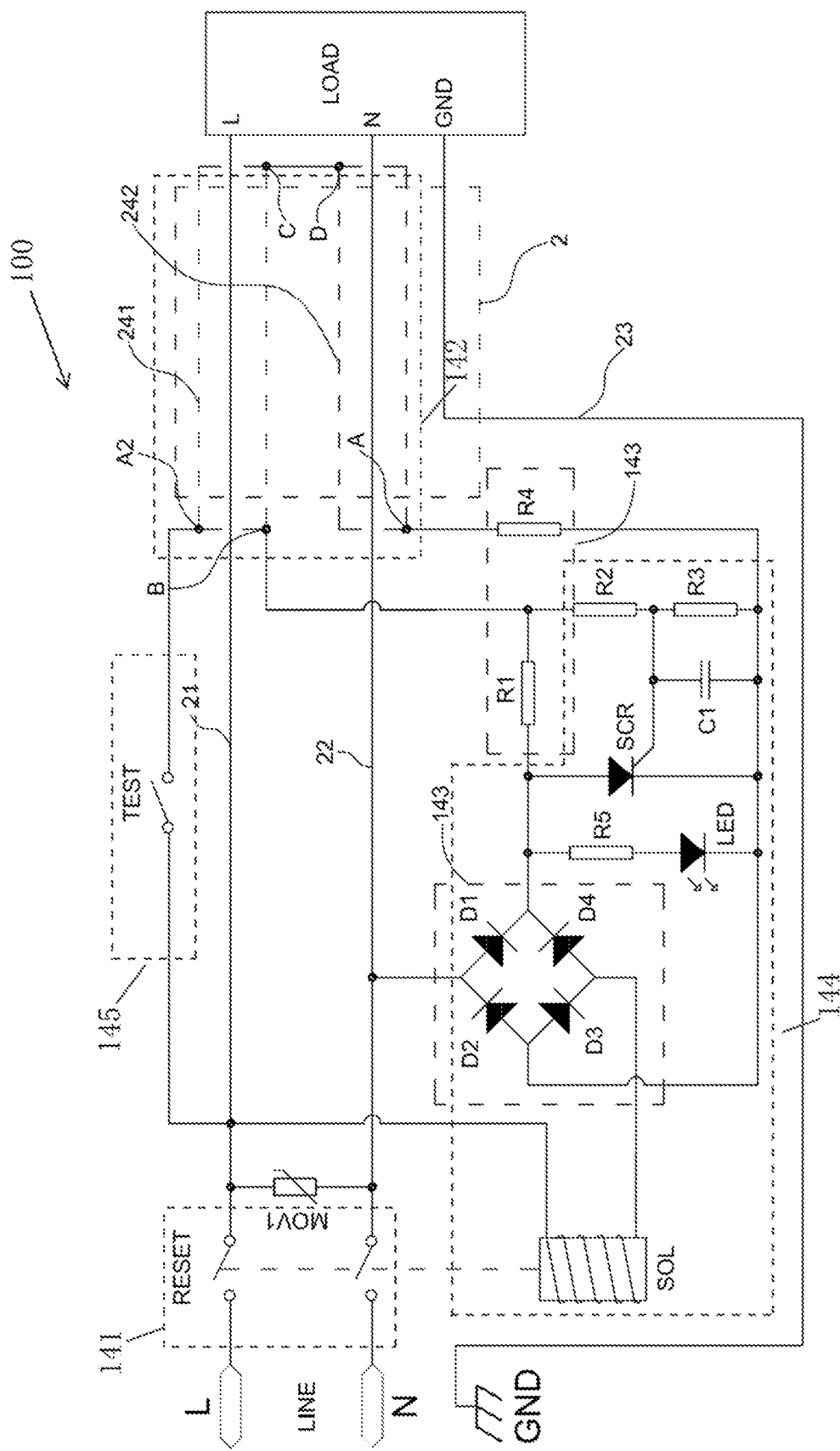
FIG. 10 is a circuit diagram showing an LCDI device according to a tenth embodiment of the present invention.

FIG. 10 is a circuit diagram schematically illustrating an LCDI device according to a tenth embodiment of the present invention. This embodiment is similar to the ninth embodiments in FIG. 9, but here, the upper end of the full-wave bridge rectifier is coupled to the neutral line N, the lower end of the full-wave bridge rectifier is coupled via the SOL to the hot line L, and the test switch TEST is coupled to the point B of leakage current detection line 241.

When the leakage current detection lines 241 and 242 are functioning normally (no open circuit), by the setting of resistors R1 and R4, the point B is limited to a relatively low voltage level, so the silicon controlled rectifier SCR is not triggered. In this condition, when the LCDI device is connected to the power source, it will function normally to conduct power to the load. When an open circuit condition exists at any point on the leakage current detection line 241 and/or 242, a current loop is formed from the neutral line N via D1 R1 R2 R3 D3 SOL to the hot line L, so that the voltage across resistor R3 increases to a sufficient level to trigger the silicon controlled rectifier SCR to be conductive. This forms a current loop from the hot line L via SOL-D4-SCR-D2 to the neutral line N. As a result, the solenoid SOL generates a magnetic field to actuate the reset switch RESET, causing the device to trip and cut off power to the load.

In this embodiment, the working principle of the test module 145 is the same as in the ninth embodiment of FIG. 9, and will not be further described.

In the above embodiments, one silicon controlled rectifier SCR is shown, but in other alternative embodiments, the circuit may include parallel-coupled multiple silicon controlled rectifiers. Further, the silicon controlled rectifier SCR may be replaced by MOS transistors, other transistors, or other semiconductor devices having controllable current conducting functions.

The LCDI devices according to embodiments of the present invention can cut off power to the load when the leakage current detection lines have an open circuit condition, thereby improving the safety of the device.

While the present invention is described above using specific examples, these examples are only illustrative and do not limit the scope of the invention. It will be apparent to those skilled in the art that various modifications, additions and deletions can be made to the LCDI device of the present invention without departing from the spirit or scope of the invention.

What is claimed is:

1. An intelligent leakage current detection and interruption device for a power cord, comprising:
   a first power line and a second power line, each having a power input end and a power output end;
   a switch module, configured to control an electrical connection of the first and second power lines between the power input end and the power output end;
   a leakage current detection module, including a first leakage current detection line and a second leakage current detection line coupled in series to form a current path from a first point of the first leakage current detection line to a second point of the first leakage current detection line, then to a second point of the second leakage current detection line, and then to a first point of the second leakage current detection line, wherein the first point and second point of the first leakage current detection line are spaced apart along the first leakage current detection line and the first point and second point of the second leakage current detection line are spaced apart along the second leakage current detection line, and wherein the first and second leakage current detection lines are configured to detect whether a leakage current is present on the first power line or the second power line;
   a detection monitoring module, coupled in series to the first and second leakage current detection lines and to the first and second power lines, and configured to detect whether an open circuit condition is present in the first or second leakage current detection line; and
   a drive module, coupled to the switch module, the leakage current detection module and the detection monitoring module, and configured to drive the switch module to cut off power to the power output end in response to any detected leakage current or open circuit condition.

2. The intelligent leakage current detection and interruption device of claim 1, wherein the detection monitoring module includes at least one resistor and/or at least one diode.

3. The intelligent leakage current detection and interruption device of claim 2, wherein the detection monitoring module includes a first diode, a first resistor, a second diode and a second resistor, wherein a first end of the first diode is coupled to a first end of the first resistor, a second end of the first diode is coupled to one of the first and second power lines, a second end of the first resistor is coupled to the first leakage current detection line, a first end of the second diode is coupled to another one of the first and second power lines, a second end of the second diode is coupled to a first end of the second resistor, and a second end of the second resistor is coupled to the second leakage current detection line.

4. The intelligent leakage current detection and interruption device of claim 2, wherein the detection monitoring module includes a first resistor, a second resistor and a first diode.

5. The intelligent leakage current detection and interruption device of claim 4, wherein the first diode is shared by the drive module and the leakage current detection module.

6. The intelligent leakage current detection and interruption device of claim 5, wherein a first end of the first resistor is coupled via the first diode and the drive module to one of the first and second power lines, a second end of the first resistor is coupled to the first leakage current detection line, and the second resistor is coupled between another one of the first and second power lines and the second leakage current detection line.

7. The intelligent leakage current detection and interruption device of claim 5, wherein a first end of the first resistor is coupled via the first diode to one of the first and second power lines, a second end of the first resistor is coupled to the first leakage current detection line, and the second resistor is coupled via the drive module between another one of the first and second power lines and the second leakage current detection line.

8. The intelligent leakage current detection and interruption device of claim 5, wherein a first end of the first resistor is coupled via the first diode to one of the first and second power lines, a second end of the first resistor is coupled to the first leakage current detection line, and the second resistor is coupled between another one of the first and second power lines and the second leakage current detection line.

9. The intelligent leakage current detection and interruption device of claim 5, wherein the first resistor is coupled between one of the first and second power lines and the first leakage current detection line, a first end of the second resistor is coupled to another one of the first and second power lines, and a second end of the second resistor is coupled to the second leakage current detection line and also to a first end of the first diode.

10. The intelligent leakage current detection and interruption device of claim 4, wherein a first end of the first diode is coupled to a first end of the first resistor, a second end of the first diode is coupled to one of the first and second power lines, a second end of the first resistor is coupled to the first leakage current detection line, the second resistor is coupled between another one of the first and second power lines and the second leakage current detection line.

11. The intelligent leakage current detection and interruption device of claim 4, wherein the first resistor is coupled between one of the first and second power lines and the first leakage current detection line, a first end of the first diode is coupled to another one of the first and second power lines, a second end of the first diode is coupled to a first end of the second resistor, and a second end of the second resistor is coupled to the second leakage current detection line.

12. The intelligent leakage current detection and interruption device of claim 4, wherein the first resistor is coupled between one of the first and second power lines and the first leakage current detection line, a first end of the second resistor is coupled to another one of the first and second power lines, a second end of the second resistor is coupled to the second leakage current detection line and also to a first end of the first diode, and a second end of the first diode is coupled to the drive module.

13. The intelligent leakage current detection and interruption device of claim 2, wherein the detection monitoring module includes a full-wave bridge rectifier, a first resistors and a second resistor, wherein the full-wave bridge rectifier is shared by the detection monitoring module and the drive module.

14. The intelligent leakage current detection and interruption device of claim 13, wherein a first end of the full-wave bridge rectifier is coupled to one of the first and second power lines, a second end of the full-wave bridge rectifier is coupled to a first end of the first resistor, a second end of the first resistor is coupled to the first leakage current detection line, a third end of the full-wave bridge rectifier is coupled to another one of the first and second power lines, a fourth end of the full-wave bridge rectifier is coupled to a first end of the second resistor, and a second end of the second resistor is coupled to the second leakage current detection line.

15. The intelligent leakage current detection and interruption device of claim 1, further comprising a test module, the test module including a test switch which is coupled to the switch module, the leakage current detection module and the detection monitoring module, and when the test switch is closed and no open circuit condition is present on the first and second leakage current detection lines, the drive module drives the switch module to disconnect power to the output end.

16. The intelligent leakage current detection and interruption device of claim 1, wherein the drive module includes a semiconductor switch having a current path and a control gate, a resistor coupled to the control gate of the semiconductor switch, and an actuator coupled to the current path of the semiconductor switch, the actuator being mechanically coupled to the switch module.

17. The intelligent leakage current detection and interruption device of claim 1, wherein the first and second leakage current detection lines are first and second shield lines respectively covering the first and second power lines.

18. The intelligent leakage current detection and interruption device claim 1,
wherein one of the first and second leakage current detection lines is a first shield line surrounding the first and second power lines, and another one of the first and second leakage current detection lines is a second shield line that surrounds the first shield line.

19. The intelligent leakage current detection and interruption device of claim 1, wherein the first leakage current detection line and the second leakage current detection line are insulated from each other except for a conductive coupling between the second point of the first leakage current detection line and the second point of the second leakage current detection line.

* * * * *